(12) United States Patent
Hwang et al.

(10) Patent No.: US 8,785,967 B2
(45) Date of Patent: Jul. 22, 2014

(54) LOCAL CRYSTALLIZATION BY HEAT TREATMENT

(75) Inventors: Tae-Hyung Hwang, Seoul (KR);
Hyun-Jae Kim, Seoul (KR);
Doh-Kyung Kim, Yongin-si (KR);
Tae-Hun Jung, Seoul (KR);
Woong-Hee Jeong, Seoul (KR);
Choong-Hee Lee, Suwon-si (KR)

(73) Assignee: Samsung Display Co., Ltd. (KR)

(*) Notice: Subject to any disclaimer, the term of this patent is extended or adjusted under 35 U.S.C. 154(b) by 867 days.

(21) Appl. No.: 12/575,347

(22) Filed: Oct. 7, 2009

(65) Prior Publication Data

US 2010/0087051 A1    Apr. 8, 2010

(30) Foreign Application Priority Data

Oct. 8, 2008    (KR) .................. 10-2008-0098644

(51) Int. Cl.
| | | |
|---|---|---|
| *H01L 21/20* | (2006.01) | |
| *C30B 1/02* | (2006.01) | |
| *C30B 29/06* | (2006.01) | |
| *H01L 21/02* | (2006.01) | |
| *H01L 27/12* | (2006.01) | |

(52) U.S. Cl.
CPC .............. *C30B 29/06* (2013.01); *C30B 1/023* (2013.01); *H01L 21/02532* (2013.01); *H01L 21/02667* (2013.01); *H01L 27/1214* (2013.01); *B32B 2457/202* (2013.01)
USPC .................................. 257/117; 257/E21.133

(58) Field of Classification Search
USPC ........ 438/486; 422/245.1; 257/E21.133, 117; 156/294
See application file for complete search history.

(56) References Cited

U.S. PATENT DOCUMENTS

| | | | | |
|---|---|---|---|---|
| 4,020,855 A | * | 5/1977 | Phelps ........................ | 132/256 |
| 4,097,718 A | * | 6/1978 | Weise .......................... | 219/222 |
| 4,738,742 A | * | 4/1988 | Shishkin et al. ............. | 156/391 |
| 5,622,193 A | * | 4/1997 | Pekarik ........................ | 132/254 |
| 6,515,346 B1 | * | 2/2003 | Kemeny ....................... | 257/618 |
| 6,911,294 B2 | * | 6/2005 | Yoshinari .................... | 430/203 |
| 2004/0231590 A1 | * | 11/2004 | Ovshinsky ................... | 118/718 |

FOREIGN PATENT DOCUMENTS

| | | |
|---|---|---|
| JP | 01-103412 A | 4/1989 |
| JP | 2005-260040 A | 9/2005 |
| KR | 1020030044793 A | 6/2003 |

* cited by examiner

*Primary Examiner* — Fernando L Toledo
*Assistant Examiner* — Neil Prasad
(74) *Attorney, Agent, or Firm* — Innovation Counsel LLP

(57) ABSTRACT

Disclosed is a crystallization apparatus capable of locally crystallizing amorphous silicon. The crystallization apparatus includes a heat emission part, a support part and a roller. The heat emission part emits heat upon receiving a heat emission source. The support part supports the heat emission part and provides the heat emission source to the heat emission part. The roller receives the heat emission part and has at least one opening to provide heat to a target (e.g., amorphous silicon). Local crystallization is performed without causing damage to a substrate.

9 Claims, 10 Drawing Sheets

LOCAL CRYSTALLIZATION BY HEAT TREATMENT

CROSS-REFERENCE TO RELATED APPLICATION

This application relies for priority upon Korean Patent Application No. 2008-98644 filed on Oct. 8, 2008, the contents of which are herein incorporated by reference in their entirety.

BACKGROUND

1. Field of the Invention

The present invention relates to a crystallization apparatus, a method of manufacturing the same and a crystallization method using the same. More particularly, the present invention relates to a crystallization apparatus capable of locally crystallizing amorphous silicon, a method of manufacturing the same and a crystallization method using the same.

2. Description of the Related Art

A liquid crystal display includes two substrates with electrodes to generate an electric field, and liquid crystals interposed between the two substrates. The liquid crystal display forms the electric field by applying a voltage to the two electrodes, and adjusts transmittance of light provided from the outside by driving the liquid crystals based on the electric field. The liquid crystal display displays images by adjusting the transmittance of light. Such a liquid crystal display is provided with a thin film transistor serving as a switching device.

The thin film transistor includes a semiconductor layer including polysilicon. The thin film transistor using the polysilicon has a high charge mobility, high response time, and superior thermal and optical stability.

The polysilicon is formed by crystallizing amorphous silicon through a solid phase crystallization, a metal induced crystallization, an excimer laser annealing, etc. Since such a crystallization method is performed at a high temperature, if a substrate on which the amorphous silicon is formed is deformed due to the high temperature, the polysilicon is hardly formed.

SUMMARY

In one aspect, the present invention includes a crystallization apparatus capable of performing local crystallization without causing damage to a substrate.

In another aspect, the present invention provides a method of manufacturing the crystallization apparatus.

In yet another aspect, the present invention provides a crystallization method using the crystallization apparatus.

In one aspect of the present invention, a crystallization apparatus includes at least one heat emission part, a support part and a roller. The heat emission part emits heat upon receiving a heat emission source. The support part supports the heat emission part and provides the heat emission source to the heat emission part. The roller accommodates the heat emission part therein and has a plurality of openings to provide heat to a target.

In another aspect of the present invention, a crystallization apparatus includes a roller, at least one heat emission part and a power line. The heat emission part is provided at an outer surface of the roller and receives external electric power to emit heat. The power line is disposed at the outer surface of the roller to provide the external power to the heat emission parts.

In one aspect of the present invention, a method of manufacturing the crystallization apparatus is provided. A roller is formed by winding a mask having a plurality of openings in a form of a roll. A support part, which receives a heat emission source from an outside, is coupled to a plurality of heat emission parts, which receive the heat emission source to emit heat. The heat emission parts are inserted into the roller.

In another aspect of the present invention, a method of manufacturing the crystallization apparatus is provided. A roller, which is provided at an outer surface thereof with a power line, is prepared. A plurality of heat emission parts, which receive electric power to emit heat, are formed on a film. The film having the heat emission parts is coupled to the roller.

In one aspect of the present invention, a crystallization method is provided. An amorphous silicon layer is formed on a substrate. A plurality of amorphous silicon patterns are formed by patterning the amorphous silicon layer. A crystallization apparatus is disposed on the substrate, and the amorphous silicon patterns are crystallized by selectively heating the amorphous silicon patterns using the crystallization apparatus.

In yet another aspect, the invention is a crystallization apparatus including an electrical network arranged in a cylindrical configuration. The electrical network includes a first power line, a second power line connected to a separate power source than the first power line, and a heat emission part connected between the first power line and the second power line and emitting heat upon receiving power from both power lines.

According to the above, the amorphous silicon can be crystallized by locally applying heat to the amorphous silicon formed on a flexible substrate. In addition, the crystallization apparatus capable of crystallizing amorphous silicon by locally applying heat to the amorphous silicon can be manufactured. Further, when manufacturing a display substrate, the amorphous silicon can be crystallized through a roll-to-roll process by using the crystallization apparatus including a roller.

BRIEF DESCRIPTION OF THE DRAWINGS

The above and other advantages of the present invention will become readily apparent by reference to the following detailed description when considered in conjunction with the accompanying drawings, wherein.

DESCRIPTION OF THE EMBODIMENTS

Figure 1:
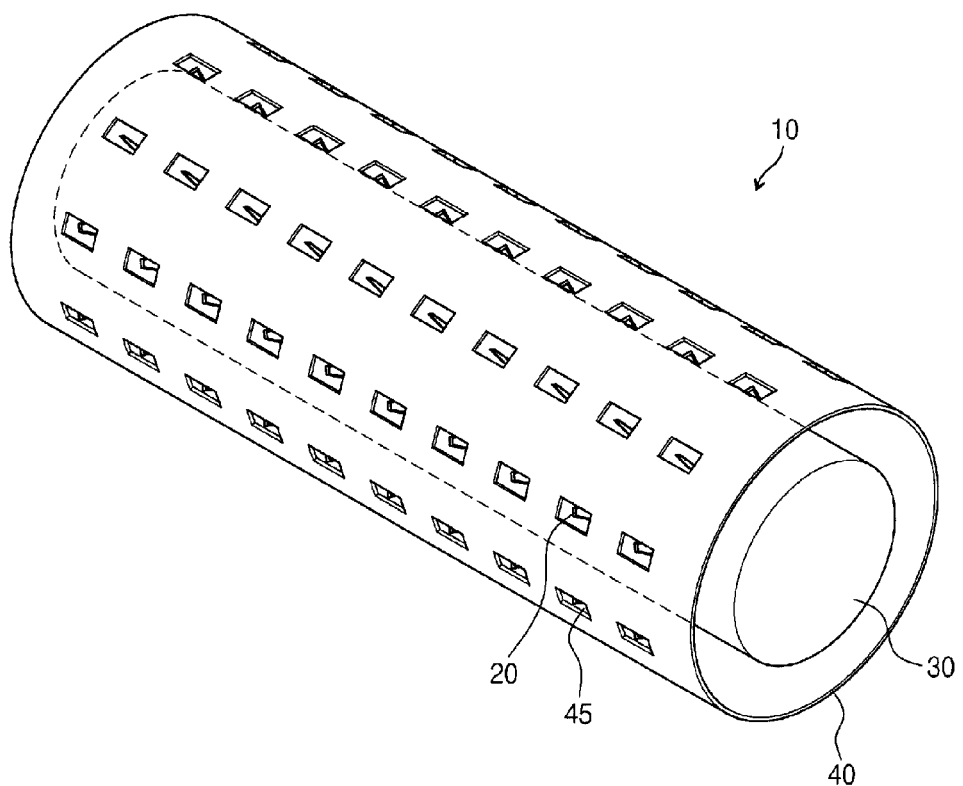
FIG. 1 is a perspective view representing a crystallization apparatus according to a first exemplary embodiment of the present invention.

Embodiments of a crystallization apparatus, a method of manufacturing the same and a crystallization method using the same will be described in detail with reference to accompanying drawings. However, the scope of the present invention is not limited to such embodiments and the present invention may be realized in various forms. The embodiments described below are provided to assist those skilled in the art to understand the present invention, and are not meant to be limitations to the invention. The size of layers and regions shown in the drawings can be simplified or magnified for the purpose of clear explanation. Also, the same reference numerals are used to designate the same elements throughout the drawings.

Figure 2A:
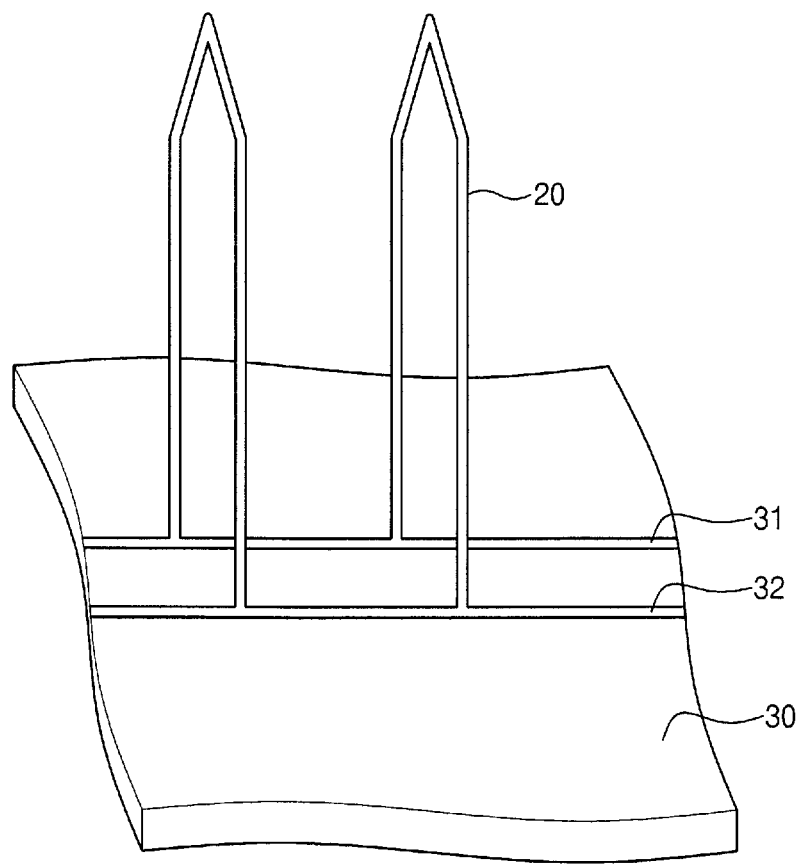
FIG. 2A is a view representing a support part and a heat emission part shown in FIG. 1.

FIG. 1 is a perspective view representing a crystallization apparatus according to a first exemplary embodiment of the present invention. FIG. 2A is a view representing a support part and a heat emission part shown in FIG. 1. The crystallization apparatus described herein is used for applying heat to a target.

Referring to FIGS. 1 and 2A, a crystallization apparatus 10 includes a support part 30, a heat emission part 20 and a roller 40.

The support part 30 has a cylindrical shape, and receives a heat emission source. For example, the support part 30 has, on its outer surface, a first power line 31 and a second power line 32 to receive first electric power and second electric power serving as the heat emission source. The first power line 31 and the second power line 32 are connected to both ends of the heat emission part 30. The support part 30 is electrically connected to an external power supply to receive the electric power. One or more heat emission parts 20 are disposed at the outer surface of the support part 30.

The heat emission parts 20 are disposed at the outer surface of the support part 30 in series or in parallel. The two ends of the heat emission part 20 are connected to the first power line 31 and the second power line 32, respectively, to form a current path. In addition, the heat emission part 20 protrudes from the outer surface of the support part 30. For example, the heat emission part 20 includes a wire shaped to have a pointy tip. In addition, the heat emission part 20 includes conductive material that receives the first and second electric power to emit heat. The heat emission part 20 includes one of tungsten (W), nickel-chrome (Ni—Cr), platinum (Pt), tungsten silicide ($WSi_2$), tantalum (Ta), tantalum silicide ($TaSi_2$), molybdenum (Mo), molybdenum silicide ($MoSi_2$) and cobalt silicide ($CoSi_2$). For example, the heat emission part 20 includes a tungsten wire such as a filament of an electric bulb and generates light by receiving the first and second electric power. The heat emission part 20 provides heat to a target by using light.

Figure 2B:
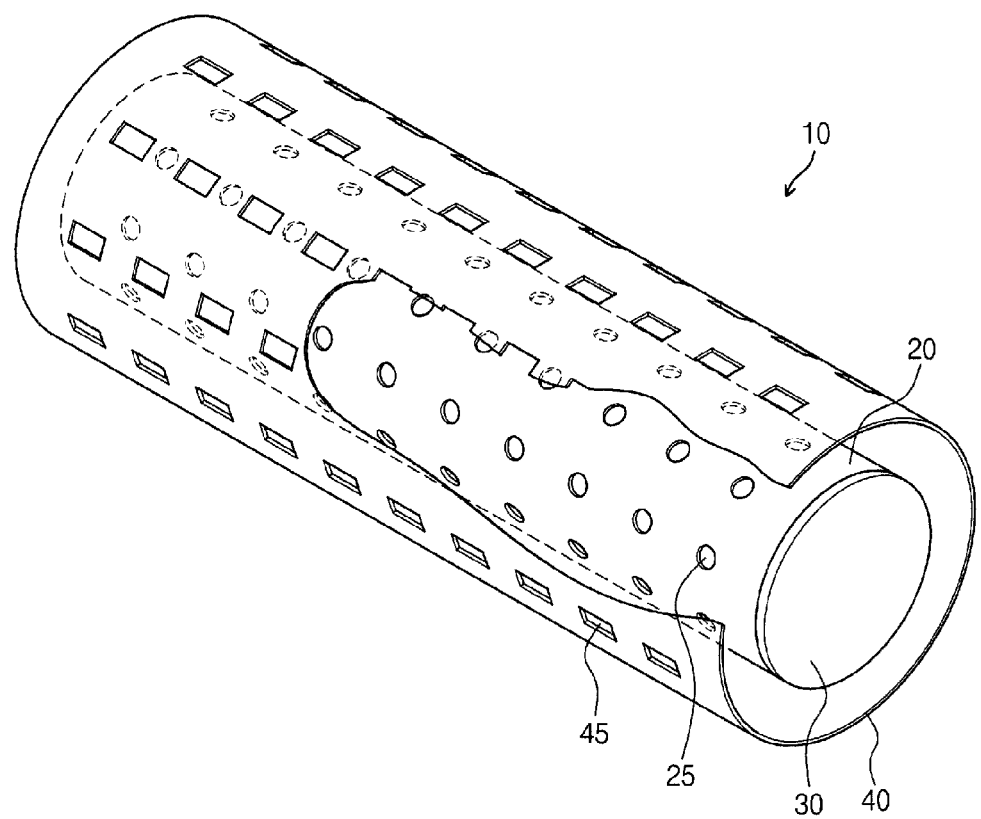
FIG. 2B is a perspective view representing a crystallization apparatus according to an alternative embodiment of the heat emission part.

FIG. 2B is a perspective view representing a crystallization apparatus according to an alternative embodiment of the heat emission part.

FIG. 2B shows an alternative embodiment of the heat emission part 20 that includes a pipe having a plurality of projecting holes 25. In this embodiment, the heat emission part 20 receives high-temperature gas serving as the heat emission source and emits gas through the projecting holes 25. The heat emission part 20 may be made of a material having superior endurance against high-temperature gas.

The heat emission part 20 may include a lamp, which receives the first and second electric power to emit pulse laser. The heat emission source may be selected from sources that can emit heat.

The roller 40 is provided in the form of a rotatable cylinder and receives the support part 30 and the heat emission part 20. The roller 40 is made of a material having superior endurance against heat emitted from the heat emission part 20. For example, the roller 40 includes tungsten (W), nickel-chrome (Ni—Cr), platinum (Pt), etc. The roller 40 includes a plurality of openings 45 to discharge heat emitted from the heat emission part 20.

The openings 45 are formed as through-holes on the surface of the roller 40. The openings 45 are spaced apart from each other by a predetermined interval, and has a predetermined area to locally apply heat to the target. For example, the openings 45 may have an area of about 10 $\mu m^2$ to about 2000 $\mu m^2$ such that amorphous silicon formed corresponding to a channel region of a thin film transistor will be subjected to a heat treatment by using the crystallization apparatus 10. The amorphous silicon of the channel region are crystallized through the heat treatment, thereby forming polycrystalline silicon.

The heat emission part 20 lines up with the openings 45. Since the heat emission part 20 is disposed corresponding to the openings 45, heat is effectively discharged. In one embodiment, each protruding tip of the heat emission part 20 lines up with one of the openings 45. In an alternative embodiment, if the area of the openings 45 is small, the heat emission part 20 is disposed in such a manner that a protruding tip of the heat emission part 20 aligns with a group of plurality of openings 45.

Now, a method for manufacturing a crystallization apparatus 10 will be described. First, the openings 45 are patterned in a mask, which is a bendable plate. Then, the mask is fixed in a rolled-up state, thereby forming the roller 40. After that, a plurality of heat emission parts 20 are coupled to the support part 30. The heat emission part 20 includes a wire provided in the form of a tip including one of tungsten (W), nickel-chrome (Ni—Cr), platinum (Pt), tungsten silicide ($WSi_2$), tantalum (Ta)_, tantalum silicide ($TaSi_2$), molybdenum (Mo), molybdenum silicide ($MoSi_2$) and cobalt silicide ($CoSi_2$). The heat emission part 20 is coupled to the support part 30 such that the two ends of the heat emission part 20 are electrically connected to the first power line 31 and the second power line 32, respectively. Then, the support part 30 coupled with the heat emission part 20 is inserted into the roller 40, thereby forming the crystallization apparatus 10. While the tips of the heat emission part 20 protrudes from the surface of the support part 30, they do not protrude far enough to interfere with the insertion into the roller 40. The support part 30 is inserted into the roller 40 such that each protruding tip of the heat emission part 20 is disposed corresponding to one of the openings 45. Alternatively, if the area of the openings 45 is small, the heat emission part 20 is disposed such that one heat emission part 20 corresponds to a plurality of openings 45.

Figure 3:
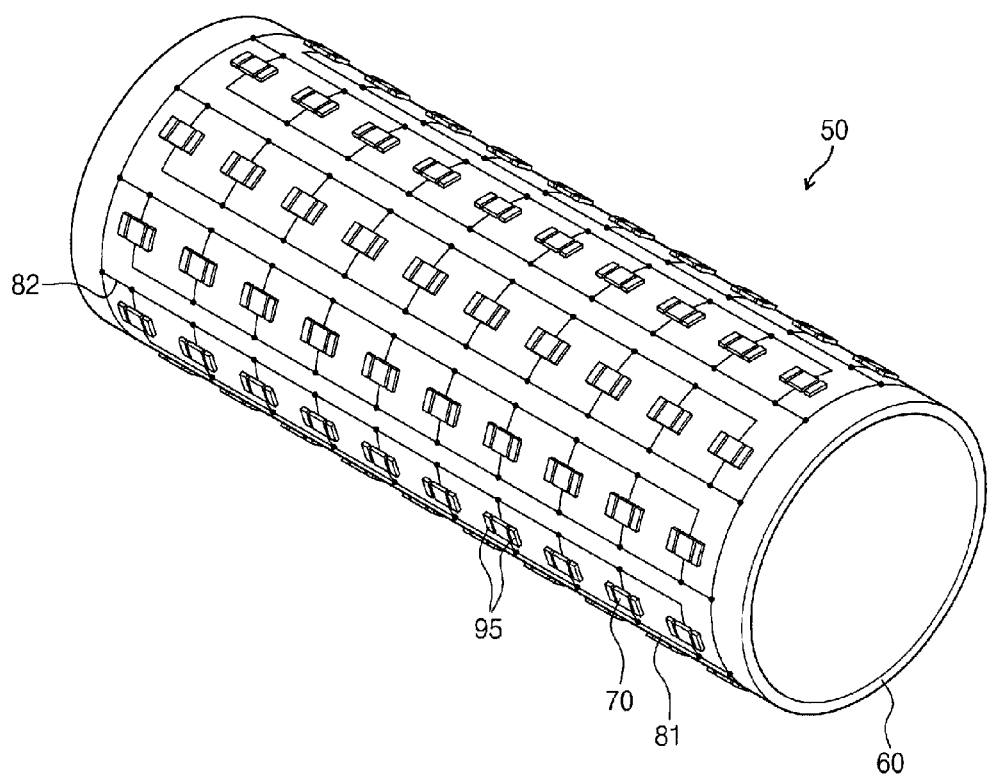
FIG. 3 is a perspective view representing a crystallization apparatus according to a second exemplary embodiment of the present invention.
Figure 4:
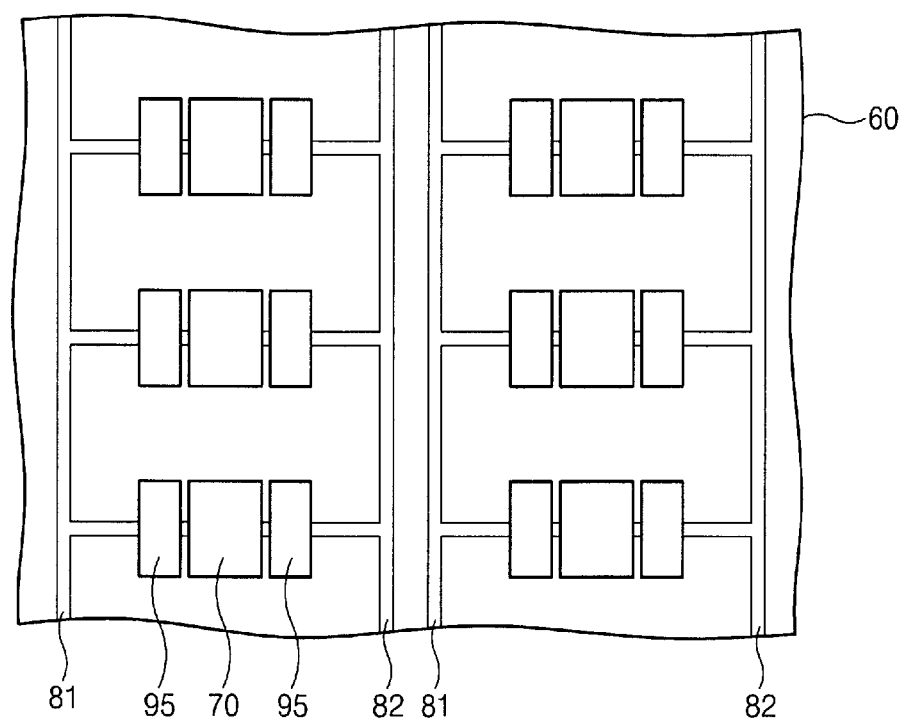
FIG. 4 is an enlarged view representing a part of the crystallization apparatus shown in FIG. 3.

Hereinafter, a crystallization apparatus according to a second exemplary embodiment of the present invention will be described with reference to FIGS. 3 and 4. FIG. 3 is a perspective view representing the crystallization apparatus according to the second exemplary embodiment of the present invention. FIG. 4 is an enlarged view representing a part of the crystallization apparatus shown in FIG. 3.

Referring to FIGS. 3 and 4, the crystallization apparatus 50 includes a roller 60 and a plurality of heat emission parts 70.

The roller 60 is provided in the form of a rotatable cylinder. On the outer surface of the roller, there is a plurality of first power lines 81 and a plurality of second power lines 82 that receive first electric power and second electric power, respectively. In addition, the roller 60 is electrically connected to a power supply, which is connected to the first and second power lines 81 and 82 to supply electric power. The roller 60 is provided at an outer surface with a plurality of heat emission parts 70 electrically connected to the first and second power lines 81 and 82.

The heat emission parts 70 are provided at the outer surface of the roller 60 in the form of a thin film shaped into a circle, an ellipse, and/or a polygonal. In the embodiment shown in FIG. 4, the heat emission parts 70 are connected to the first and second power lines 81 and 82 in parallel, and are disposed on the outer surface of the roller 60 while being spaced apart from each other by a predetermined interval. The heat emission parts 70 emit heat by receiving the first and second electric powers through the first power line 81 and the second power line 82, respectively.

The heat emission parts 70 are made of a conductive material that receives the first and second electric power to emit heat. Each of the heat emission part 70 includes one of tungsten (W), nickel-chrome (Ni—Cr), platinum (Pt), tungsten silicide ($WSi_2$), tantalum (Ta), tantalum silicide ($TaSi_2$), molybdenum (Mo), molybdenum silicide ($MoSi_2$) and cobalt silicide ($CoSi_2$). For example, the heat emission parts 70 include tungsten (W) and generate light using the first and second electric power. The heat emission parts 70 provide heat to a target by using light.

The heat emission parts 70 are provided at the outer surface of the roller 60, and includes a plurality of thermal pads 95 disposed next to the heat emission parts 70. The thermal pads 95 prevent the heat generated by the heat emission parts 70 from dissipating laterally and prevent the heat emission parts 70 from being damaged when the heat emission parts 70 make contact with the target. In the crystallization apparatus 50, the heat emission parts 70 can be disposed in a plurality of grooves (not shown) formed on the outer surface of the roller 60.

The crystallization apparatus 50 is manufactured through the method described below. First, the roller 60 is prepared. The first power lines 81 and the second power lines 82 are formed on the outer surface of the roller 60 using a conductive material. Then, the heat emission parts 70 are formed on a thin film while being spaced apart from each other in a predetermined interval. The heat emission part 20 is provided in the form of a thin film including one of tungsten (W), nickel-chrome (Ni—Cr), platinum (Pt), tungsten silicide ($WSi_2$), tantalum (Ta), tantalum silicide ($TaSi_2$), molybdenum (Mo), molybdenum silicide ($MoSi_2$) and cobalt silicide ($CoSi_2$). When viewed in a plan view, the heat emission parts 70 may have a circular shape, an elliptical shape or a polygonal shape. In addition, the thermal pads 95 are formed next to (e.g., adjacent to) the heat emission parts 70. The thermal pads 95, which may be made of a metal having a resistance lower than that of the heat emission parts 70, surround the heat emission parts 70. After that, the film on which the heat emission parts 70 are formed is coupled to the roller 60, thereby forming the crystallization apparatus 50. For example, the film and the roller 60 are coupled by using a screw and a screw hole corresponding to the screw. In another example, the film and the roller 60 are coupled by using an adhesive material. The roller 60 is coupled to the film such that the heat emission parts 70 are electrically connected to the first power lines 81 and the second power lines 82.

Figure 5:
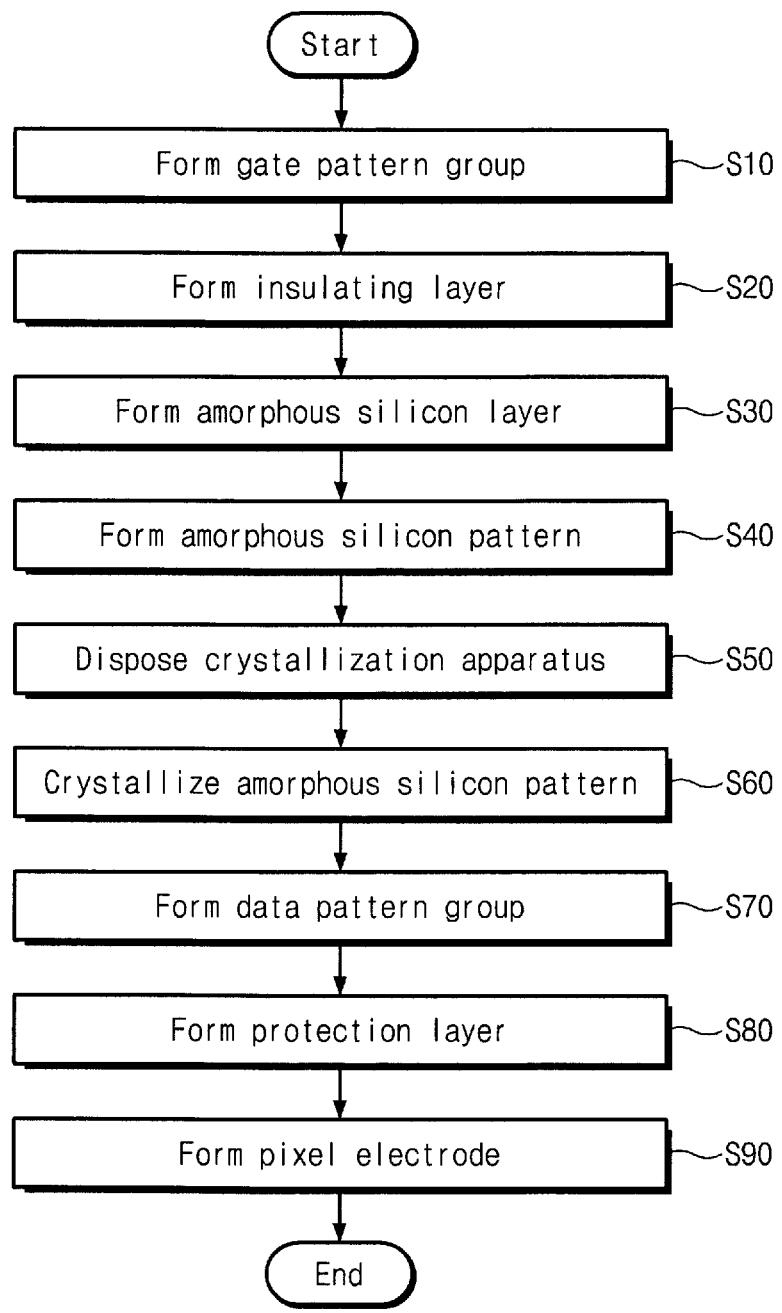
FIG. 5 is a flowchart showing a method of manufacturing a display substrate using the crystallization method according to a first exemplary embodiment of the present invention.
Figure 6:
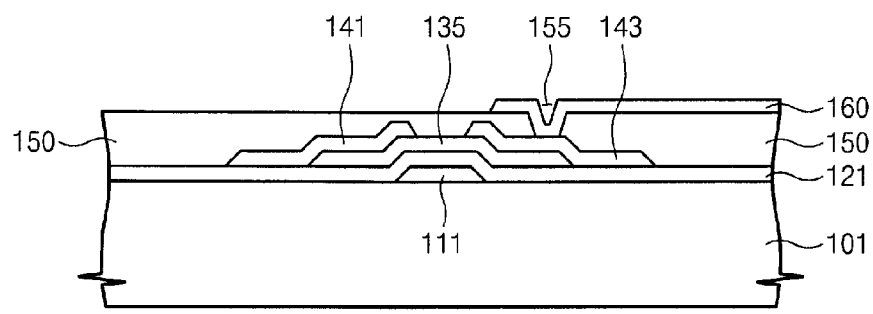
FIG. 6 is a sectional view representing the display substrate formed through the crystallization method according to the first exemplary embodiment of the present invention.
Figure 7:
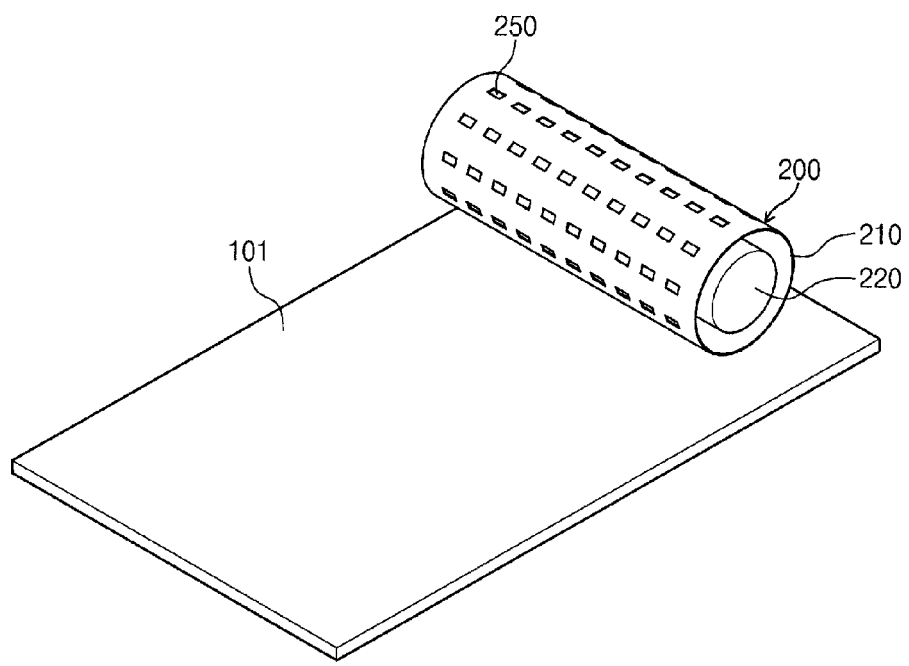
FIGS. 7 to 9 are views showing the crystallization method represented in FIG. 5.
Figure 8:
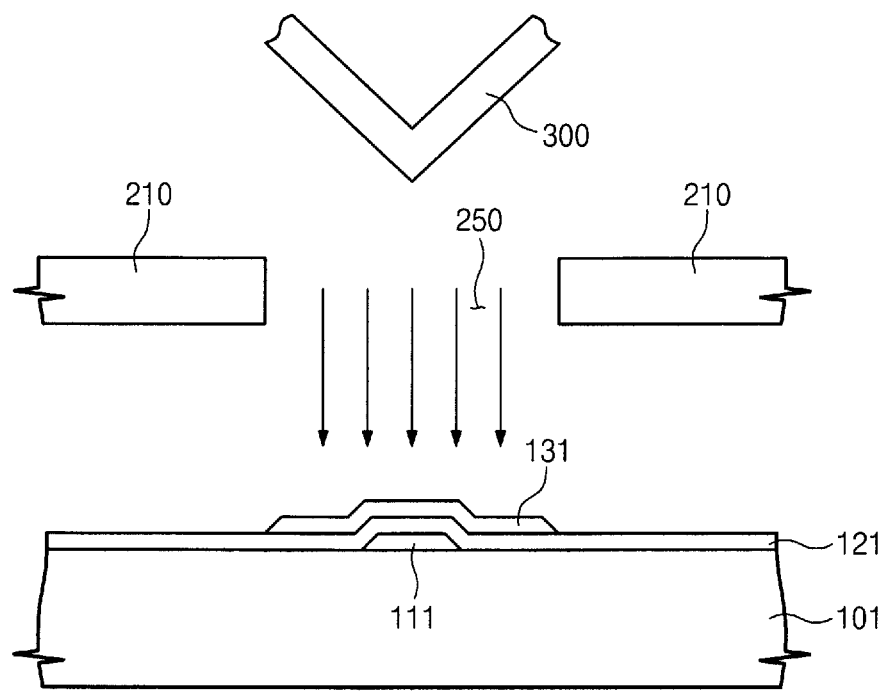
Figure 9:
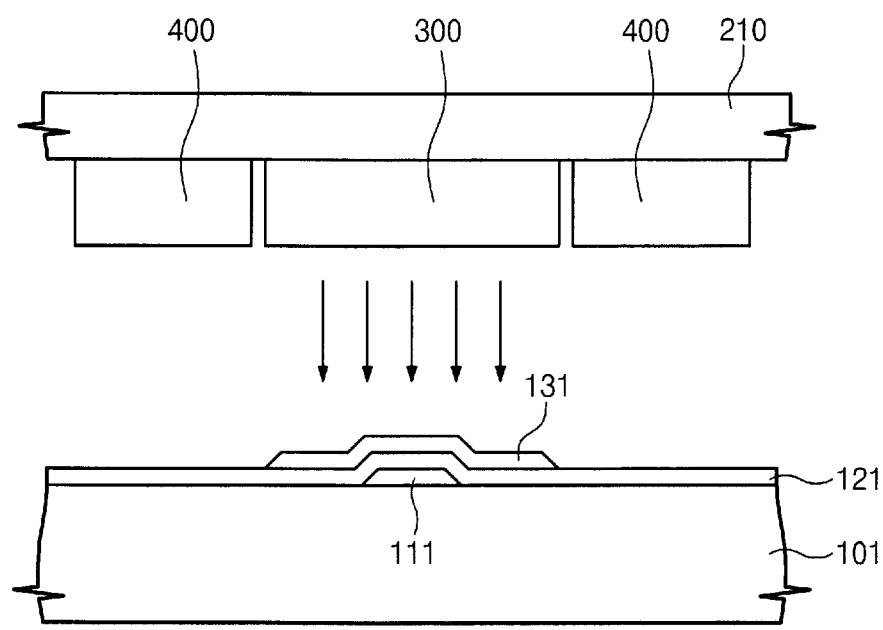

Hereinafter, a crystallization method performed by using the crystallization apparatus 10 will be described with reference to FIGS. 5 to 9. FIG. 5 is a flowchart showing a method of manufacturing a display substrate using the crystallization method according to the first embodiment of the present invention. FIG. 6 is a sectional view representing the display substrate formed through the crystallization method according to the first embodiment of the present invention. FIGS. 7 to 9 are views showing the crystallization method represented in FIG. 5.

Since the crystallization method according to the first embodiment of the present invention is used to manufacture a display substrate, in which polycrystalline silicon is formed by crystallizing the amorphous silicon of a thin film transistor, the following description will be focused on the method of manufacturing the display substrate including the thin film transistor.

First, gate metal is deposited on a substrate 101 including flexible material such as plastic, and the gate metal is patterned through a photolithography process. Accordingly, a plurality of gate pattern groups are formed (S10). Each of the gate pattern groups includes a plurality of gate lines extending in one direction on the substrate 101 and a plurality of gate electrodes 111 branching from the gate line.

Then, a material including either silicon nitride (SiNx) or silicon oxide (SiOx) is deposited on the substrate 101 and the gate pattern group, thereby forming an insulating layer 121 to insulate the gate pattern group (S20).

After that, amorphous silicon is deposited on the insulating layer 121 through Chemical Vapor Deposition (hereinafter, referred to as a CVD), thereby forming an amorphous silicon layer (S30).

Then, the amorphous silicon layer is patterned through a photolithography, thereby forming a plurality of amorphous silicon patterns 131 overlapping the gate electrodes 111 (S40).

As shown in FIGS. 7 to 9, a crystallization apparatus 200 is disposed above the substrate 101 on which the amorphous silicon patterns 131 are formed (S50). As shown in FIGS. 7 and 8, the crystallization apparatus 200 includes a roller 210 having a plurality of openings 250, at least one heat emission part 300 in the roller 210, and a support part 220 which supports the heat emission parts 70 and provides electrical power connection to the heat emission part 300. The heat emission part 300 is provided in the form of a protruding tip made of a conductive material, and emits heat by generating light using electric power. In an alternative embodiment, a plurality of projecting holes are formed in the heat emission part 300, and the heat emission part 300 includes pipes, which receive high-temperature gas serving as the heat emission source (e.g., see FIG. 2B). In addition, the heat emission part 300 includes lamps, which receive electric power serving as the heat emission source to emit pulse laser. For example, the heat emission part 300 in FIG. 8 may emit pulse laser as the lamps.

Meanwhile, as shown in FIG. 9, the crystallization apparatus 200 includes the roller 210, which is provided at an outer surface thereof with a plurality of first power lines and a plurality of second power lines, and a plurality of heat emission parts 300 which protrude from the outer surface of the roller 210 in the form of a circle, an ellipse or a polygon. In addition, the crystallization apparatus 200 further includes a thermal pad 400 disposed next to the heat emission parts 300 to prevent lateral dissipation of the heat emitted from the heat emission parts 300. The heat emission parts 300 receive electric power serving as the heat emission source to emit heat.

After that, the amorphous silicon patterns 131 are crystallized through the process shown in FIGS. 8 and 9, thereby forming a semiconductor layer 135 (S60). In detail, as shown in FIG. 8, the roller 210 disposed above the amorphous silicon patterns 131 is rotated such that the openings 250 overlap the amorphous silicon patterns 131, respectively. The heat emission parts 300 are installed inside the roller 210 and aligned with the openings 250. After the openings 250 are aligned with the amorphous silicon patterns 131, the roller 210 is fixed. Then, electric power is provided to the heat emission part 300, and heat generated from the heat emission part 300 is provided to the amorphous silicon pattern 131 through the openings 250, respectively. At this time, the heat emission part 300 is disposed adjacent to the amorphous silicon pattern 131 and provides the generated heat to the amorphous silicon pattern 131. The heat emission parts 300 provide heat to the amorphous silicon patterns 131, for example, for about 2 minutes to about 5 minutes. The amorphous silicon pattern 131 is crystallized in the form of crystalline silicon by the heat, thereby forming the semiconductor layer 135. As described above, the crystallization apparatus 200 locally crystallizes the amorphous silicon patterns 131 without causing damage to the substrate 101.

FIG. 9 illustrates the heat treatment process using the crystallization apparatus 50 of FIG. 3. The roller 210 on which the heat emission parts 300 are formed is rotated above the amorphous silicon patterns 131 such that the heat emission parts 300 overlap the amorphous silicon patterns 131. The heat emission parts 300 is disposed adjacent to the silicon pattern 131. The heat emission parts 300 are spaced apart from one another on the outer surface of the roller 210 by a predetermined interval. After the heat emission parts 300 have been aligned with the amorphous silicon patterns 131, the roller 210 is fixed, temporarily. Then, electric power is provided to the heat emission parts 300, and heat generated from the heat emission parts 300 is provided to the amorphous silicon patterns 131. The amorphous silicon patterns 131 are crystallized in the form of crystalline silicon by the heat, thereby forming the semiconductor layer 135.

After data metal has been deposited on the semiconductor layer 135, the data metal is patterned through a photolithography process, thereby forming a data pattern group which includes a data line crossing the gate line, a source electrode 141 branching from the data line and a drain electrode 143 which is electrically connected to the source electrode 141 through the semiconductor layer 135 while being spaced apart from the source electrode 141 (S70).

Then, a protection layer 150 is formed by depositing organic material or inorganic material on the insulating layer 121, the semiconductor layer 135 and the data pattern group, and then a part of the protection layer 150 overlapping the drain electrode 143 is partially etched, thereby forming a contact hole 155 through which a part of the drain electrode 143 is exposed (S80).

After that, a pixel electrode 160, which includes transparent conductive material and makes contact with the drain electrode 143 through the contact hole 155, is formed on the protection layer 150 (S90).

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. For instance, the present invention is applicable for various fields to locally crystallize the amorphous silicon.

What is claimed is:

1. An apparatus comprising:
a crystallization apparatus for crystallizing a semiconductor layer, the crystallization apparatus having:
   a roller;
   at least one heat emission part that is provided at an outer surface of the roller and is configured to receive external electric power so as to emit heat, each heat emission part being sized to correspond to the semiconductor layer of a thin film transistor;
   an electrical network arranged in a cylindrical configuration, the electrical network including a first power line and a second power line connected to a separate power source from the first power line to provide the external electric power to the heat emission part.

2. An apparatus comprising:
a crystallization apparatus for crystallizing a semiconductor layer, the crystallization apparatus having:
   at least one heat emission part configured to emit heat;
   an electrical network arranged in a cylindrical configuration, the electrical network including a first power line and a second power line connected to a separate power source from the first power line;
   a support part that supports the heat emission part; and
   a roller that receives the heat emission part and comprises at least one opening that is aligned with the heat emission part and that is sized to correspond to the semiconductor layer of a thin film transistor,
   wherein the heat emission part is connected between the first power line and the second power line to receive power from the first power line and the second power line.

3. The crystallization apparatus of claim 2, wherein the first power line and the second power line are disposed on an outer surface of the support part.

4. The crystallization apparatus of claim 3, wherein the heat emission part comprises a protruding tip comprising two ends that are connected to the first power line and the second power line, respectively.

5. The crystallization apparatus of claim 4, wherein the protruding tip is aligned with the opening to emit heat through the opening.

6. The crystallization apparatus of claim 4, wherein the heat emission part comprises one of tungsten, nickel-chrome, and platinum.

7. The crystallization apparatus of claim 2, wherein the heat emission part comprises a lamp and the lamp is configured to receive electric power from the first power line and the second power line so as to emit a pulsed laser beam.

8. The crystallization apparatus of claim 7, wherein the heat emission part protrudes from the outer surface of the roller and is shaped into a circle, an ellipse or a polygon.

9. The crystallization apparatus of claim 8, wherein the heat emission part comprises one of tungsten, nickel-chrome, and platinum.

* * * * *